US008653554B2

(12) United States Patent
Xu et al.

(10) Patent No.: US 8,653,554 B2
(45) Date of Patent: *Feb. 18, 2014

(54) PHOSPHOR PLACEMENT IN WHITE LIGHT EMITTING DIODE ASSEMBLIES

(71) Applicant: Bridgelux, Inc., Livermore, CA (US)

(72) Inventors: Tao Xu, Fremont, CA (US); Zhengqing Gan, Clayton, CA (US)

(73) Assignee: Bridgelux, Inc., Livermore, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/012,901

(22) Filed: Aug. 28, 2013

(65) Prior Publication Data
US 2013/0341669 A1  Dec. 26, 2013

Related U.S. Application Data

(63) Continuation of application No. 13/361,965, filed on Jan. 31, 2012, now Pat. No. 8,541,802.

(51) Int. Cl.
*H01L 33/00* (2010.01)
*H01L 21/00* (2006.01)

(52) U.S. Cl.
USPC ............................................. 257/98; 438/27

(58) Field of Classification Search
USPC ............................................. 257/98; 438/27
See application file for complete search history.

(56) References Cited

U.S. PATENT DOCUMENTS

| 6,917,057 | B2 | 7/2005 | Stokes et al. | 257/98 |
| 7,250,714 | B2 | 7/2007 | Pyun et al. | 313/477 R |
| 8,541,802 | B2 * | 9/2013 | Xu et al. | 257/98 |

* cited by examiner

*Primary Examiner* — Fernando L Toledo
*Assistant Examiner* — Neil Prasad
(74) *Attorney, Agent, or Firm* — Imperium Patent Works; T. Lester Wallace

(57) ABSTRACT

A white LED assembly includes a blue LED die attached to a substrate. A first volume of a first luminescent material surrounds the blue LED die in a lateral dimension such that none of the first luminescent material is disposed directly over the blue LED die. The first luminescent material includes a relatively inefficient phosphor having a peak emission wavelength longer than 620 nm and includes substantially no phosphor having a peak emission wavelength shorter than 620 nm. A second volume of a second luminescent material is disposed over the first volume and the blue LED die. The second luminescent material includes a relatively efficient phosphor having a peak emission wavelength shorter than 620 nm and includes substantially no phosphor having a peak emission wavelength longer than 620 nm. Placement of the first and second luminescent materials in this way promotes removal of heat from the inefficient phosphor and reduces the likelihood of interabsorption.

20 Claims, 8 Drawing Sheets

CROSS-SECTIONAL VIEW

CROSS-SECTIONAL VIEW

TOP-DOWN VIEW

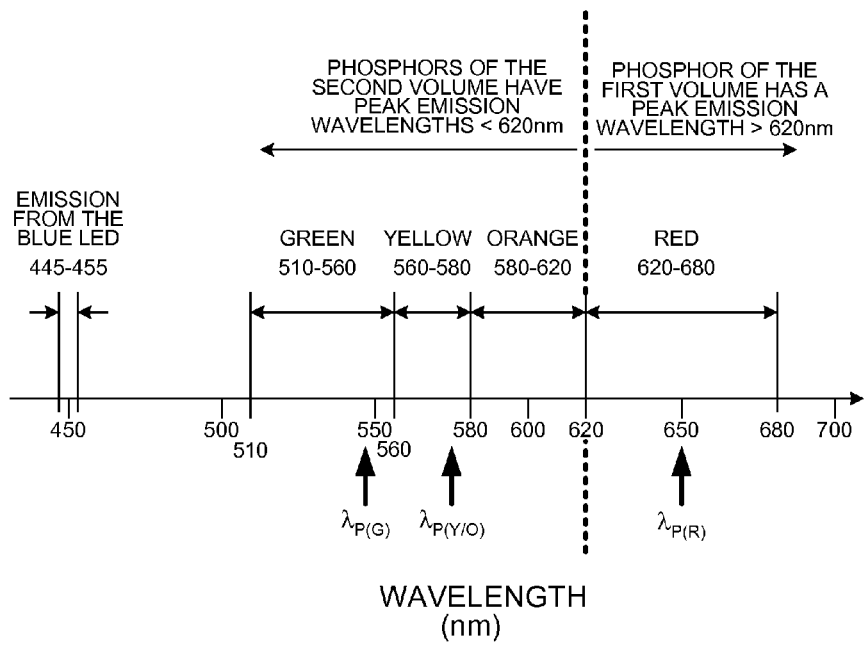

FIG. 13

| SYMBOL | EMISSION COLOR | $\lambda_P$ (nm) | TYPE OF PHOSPHOR | DOPANT | SIMPLIFIED FORMULA |
|---|---|---|---|---|---|
| × | "GREEN" | 545 $\lambda_{P(G)}$ | ALUMINATE-BASED | EUROPIUM ($Eu^{2+}$) | $M_{1-X}Eu_XAl_YO_{[1+3Y/2]}$<br>M=Sr, Ba, Ca (2+ ion) |
| ○ | "YELLOW/ ORANGE" | 574 $\lambda_{P(Y/O)}$ | SILICATE-BASED | EUROPIUM ($Eu^{2+}$) | $A_3Si(OD)_4:Eu^{2+}$ or $A_3Si(OD)_5:Eu^{2+}$<br>A=Sr, Ba, Ca (2+ ion)<br>D=Cl, F, N, S (1- ion) |
| ● | "RED" | 650 $\lambda_{P(R)}$ | NITRIDE-BASED | EUROPIUM ($Eu^{2+}$) | $CaAlSiN_3:Eu^{2+}$ |

EXEMPLARY SYSTEM OF PHOSPHORS

FIG. 14

PHOSPHOR PLACEMENT IN WHITE LIGHT EMITTING DIODE ASSEMBLIES

CROSS REFERENCE TO RELATED APPLICATIONS

This application is a continuation of, and claims priority under 35 U.S.C. §120 from, nonprovisional U.S. patent application Ser. No. 13/361,965 entitled "Phosphor Placement In White Light Emitting Diode Assemblies," filed on Jan. 31, 2012, now U.S. Pat. No. 8,541,802, the subject matter of which is incorporated herein by reference.

TECHNICAL FIELD

The present disclosure relates generally to white LED (Light Emitting Diode) assemblies.

BACKGROUND INFORMATION

A so-called white Light Emitting Diode (LED) is a solid state device that converts electrical energy into light. FIG. 1 (Prior Art) is a simplified cross-sectional diagram of a white LED assembly 1. The white LED assembly is actually an assembly that includes a blue light emitting diode (LED) die 2, commonly referred to as a blue LED. The active region 3 within the blue LED die is an InGaN/GaN Multiple Quantum Well (MQW) structure. The blue LED die therefore emits relatively narrowband blue light having a wavelength in a range from 455 nanometers (nm) to about 455 nm. Blue LED die 2 is mounted in a reflector cup of a substrate 4. In addition to blue LED die 2 and substrate 4, the white LED assembly 1 includes an amount of luminescent material 5. Luminescent material 5 includes phosphor particles and a transparent binding material. The luminescent material may be generally referred to as "phosphor", even though more accurately it includes the binding material and phosphor particles. In the example illustrated in FIG. 1, luminescent material 5 includes a mixture of three types of phosphor particles suspended in a transparent silicone binding material.

A solid black dot symbol represents a red-emitting phosphor particle. A particular red-emitting phosphor particle may, for example, absorb blue light emitted form the LED die. The blue light has a wavelength of 455 nm. The red-emitting phosphor particle then re-emits some of the absorbed energy as red light. The emission spectrum of the re-emitted light is centered at a peak wavelength of about 650 nm.

A small dot symbol having a white center represents an orange/yellow-light emitting phosphor particle. A particular yellow/orange-emitting phosphor particle may, for example, absorb 455 nm blue light from the blue LED die, and then re-emit some of the absorbed energy as yellow/orange light. The emission spectrum of the re-emitted light is centered at a peak wavelength of about 574 nm.

A small "x" symbol represents a green-emitting phosphor particle. A particular green-emitting phosphor particle may, for example, absorb 455 nm blue light from the blue LED die, and can then re-emit some of the absorbed energy as green light. The emission spectrum of the re-emitted light is centered at a peak wavelength of about 545 nm.

Some of the blue light emitted by blue LED die 2 passes all the way through the fluorescent material 5 without being absorbed by any phosphor particle and exits the LED device 1 as blue light. Another portion of the blue light emitted by the blue LED die is absorbed by red-emitting phosphor particles such that the red-emitting phosphor particles emit red light that in turn exits the LED device. Another portion of the blue light emitted by the blue LED die is absorbed by yellow/orange-emitting phosphor particles such that the yellow/orange-emitting particles emit yellow/orange light that in turn exits the LED device. Another portion of the blue light emitted by the blue LED die is absorbed by green-emitting phosphor particles such that the green-emitting particles emit green light that in turn exits the LED device. The relative amounts, types, and relative positioning of the three different phosphors within the LED device structure is such that the color spectrum of the combined light that exits the LED device appears to the human eye as being "white". The LED device is therefore commonly referred to as a "white LED".

FIG. 2 (Prior Art) is a simplified cross-sectional diagram of a part of white LED device 1. Each arrow in the diagram represents the path of a photon. The photon represented by arrow 6 is blue light that passes through the fluorescent material 5 and exits the LED device as blue light. The photon represented by arrow 7 is blue light that is absorbed by a red-emitting phosphor particle, that in turn emits a red light photon 8 that exists the LED device. The photon represented by arrow 9 is blue light that is absorbed by a yellow/orange-emitting phosphor particle, that in turn emits yellow/orange light 10 that exits the LED device. The photon represented by arrow 11 is blue light that is absorbed by a green-emitting phosphor particle, that in turn emits green light 12 that exits the LED device.

A phenomenon referred to as "interabsorption" can also occur. A phosphor particle can absorb light emitted from another phosphor particle. For example, a blue light photon represented by arrow 13 is absorbed by a green-emitting phosphor particle. The green-emitting phosphor particle then re-emits green light represented by arrow 14. Rather than exiting the LED assembly, the green light is absorbed by a red-emitting phosphor particle. The red-emitting phosphor particle then re-emits red light 15. Similarly, arrow 16 represents a blue light photon that is absorbed by a yellow/orange-emitting phosphor particle. The yellow/orange-emitting phosphor particle then re-emits yellow-orange light 17. Rather than the yellow/orange light exiting 17 the LED device, the yellow/orange light 17 is absorbed by a red-emitting phosphor particle, that in turn emits red light 18. Although not illustrated, other complex interabsorption events can occur. For example, light emitted from an excited green-emitting phosphor particle may be absorbed by absorbed by a yellow/orange-emitting phosphor particle.

FIGS. 3-6 (Prior Art) are diagrams of LED assemblies set forth in U.S. Pat. No. 7,250,714. In the LED assembly 19 of FIG. 3, the red-emitting phosphor 20 and the green/yellow-emitting phosphor 21 are deposited adjacent to each other with respect to blue LED die 22 such that absorption by the red-emitting phosphor of light emitted by the green/yellow emitting phosphor is reduced. In the LED assembly 23 of FIG. 4, the green/yellow-emitting phosphor 24 and the red-emitting phosphor 25 are deposited over LED die 26 as discrete layers, with the red-emitting phosphor layer 25 deposited closest to the LED 26. The green/yellow emitting-phosphor layer and the red-emitting phosphor layers may be separated by an optional transparent layer 27. In the LED assembly 28 of FIG. 5, the green/yellow-emitting phosphor 29 and the other phosphors 30 are deposited in a plurality of small regions on a blue LED die 31 as illustrated. In the LED assembly 32 of FIG. 6, small regions 33 of red-emitting phosphor are formed on the surface of a blue LED die 34. A layer of green/yellow-emitting phosphor 35 is deposited over the plurality of regions 33 as illustrated. In each of the LED assemblies of FIGS. 3-6, the arrangements of the yellow/orange-emitting phosphor and the red-emitting phosphor reduce the probability that light emitted from the green/yellow-emitting phosphor will be absorbed by the red-emitting phosphor. See U.S. Pat. No. 7,250,714 for further details.

SUMMARY

A white LED assembly includes a blue LED die attached to a substrate. The blue LED die may, for example, be either a laterally-contacted blue LED die or a vertically-contacted blue LED die. The blue LED die is capable of emitting blue light. The blue LED defines a Right Rectangular Prism (RRP) whose base face is the bottom of side of the die. A first peripheral side of the die lies in a first plane that is coplanar with a first side face of the RRP. A second peripheral side of the die lies in a second plane that is coplanar with a second side face of the RRP. A third peripheral side of the die lies in a third plane that is coplanar with a third side face of the RRP. A fourth peripheral side of the die lies in a fourth plane that is coplanar with a fourth side face of the RRP.

The white LED assembly further includes a first volume of a first luminescent material that is formed to surround the blue LED die in a lateral dimension such that the first luminescent material is in contact with the substrate and such that substantially none of the first luminescent material is disposed directly over the blue LED die. The first volume is formed such that the first volume is disposed entirely outside the RRP.

The first luminescent material comprises a first phosphor material and a transparent binding material such as silicone. The first phosphor material is capable of absorbing blue light from the blue LED die and emitting light having a first peak wavelength longer than 620 nm. The first luminescent material comprises substantially no phosphor material capable of emitting light having a peak wavelength shorter than approximately 620 nm. The first phosphor material may be red-emitting phosphor particles.

The white LED assembly further includes a second volume of a second luminescent material that is formed such that the second volume is disposed at least in part above the die within the RRP. The second luminescent material comprises a second phosphor material and a transparent material such as silicone. The second phosphor material is capable of absorbing blue light from the blue LED die and emitting light having a second peak wavelength shorter than 620 nm. The second luminescent material comprises substantially no phosphor material capable of emitting light having a peak wavelength longer than approximately 620 nm. The second phosphor material may be a mixture of yellow/orange-emitting phosphor particles and green-emitting particles.

The first phosphor material has a relatively low conversion efficiency as compared to the conversion efficiency of the second phosphor material. Placement of the first and second luminescent materials in the white LED assembly promotes removal of heat from the inefficient first phosphor material and reduces the likelihood of interabsorption.

Further details and embodiments and methods are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

FIG. 13 is a diagram that shows the ranges of wavelengths that are considered to be red light, orange light, yellow light, and green light, in one example.

FIG. 14 is a table that illustrates an exemplary system of phosphors for the white LED assembly of FIG. 7.

DETAILED DESCRIPTION

Reference will now be made in detail to some embodiments of the invention, examples of which are illustrated in the accompanying drawings. In the description and claims below, when a first object is referred to as being disposed "on" a second object, it is to be understood that the first object can be directly on the second object, or an intervening object may be present between the first and second objects. Similarly, terms such as "above", "beneath", "lateral", "vertical", "upper", and "lower" are used herein to describe relative orientations between different parts of the white LED assembly structure being described, and it is to be understood that the overall white LED assembly being described can actually be oriented in any way in three-dimensional space.

Figure 1:
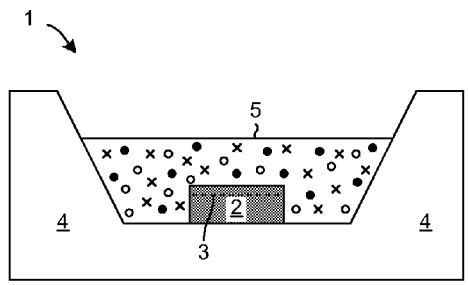
FIG. 1 (Prior Art) is a simplified cross-sectional diagram of a white LED assembly.
Figure 2:
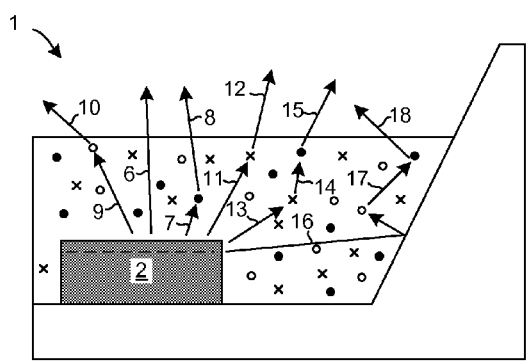
FIG. 2 (Prior Art) is a simplified cross-sectional diagram of a part of the white LED device of FIG. 1.
Figure 3:
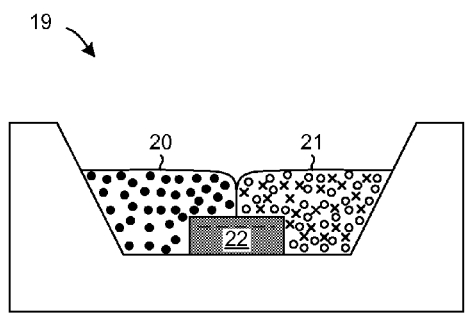
FIGS. 3-6 (Prior Art) are diagrams of various LED assemblies set forth in U.S. Pat. No. 7,250,714.
Figure 4:
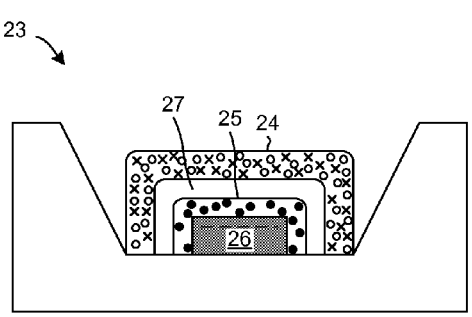
Figure 5:
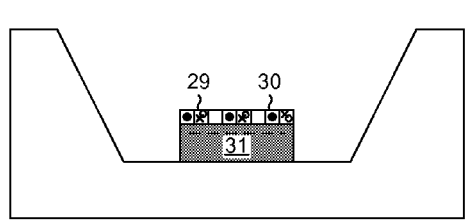
Figure 6:
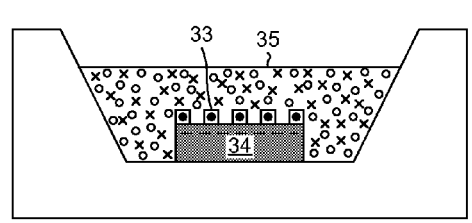
Figure 7:
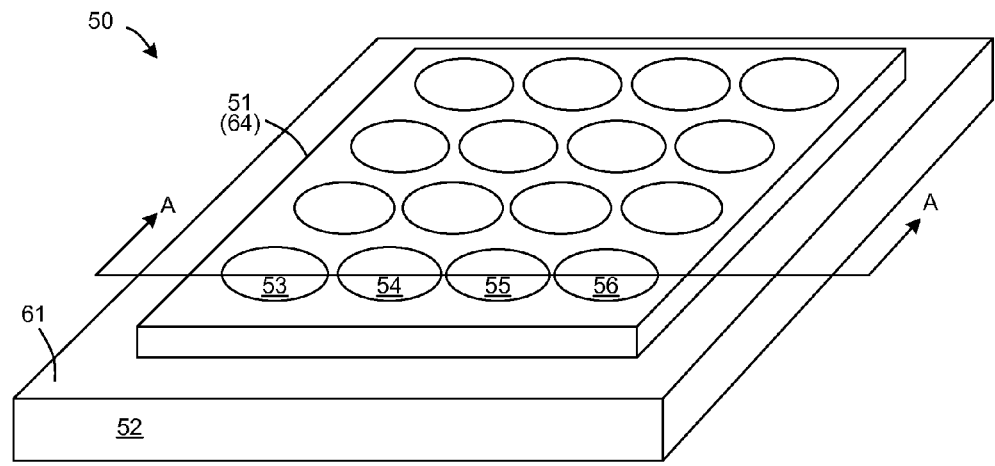
FIG. 7 is a simplified perspective diagram of a white LED assembly in accordance with one novel aspect.

FIG. 7 is a simplified perspective diagram of a white LED assembly 50 in accordance with one novel aspect. A molded two-dimensional array 51 of dome-shaped mini-lens structures is disposed on a square substrate 52. Reference numerals 53-56 identify four of these dome-shaped mini-lens structures.

Figure 8:
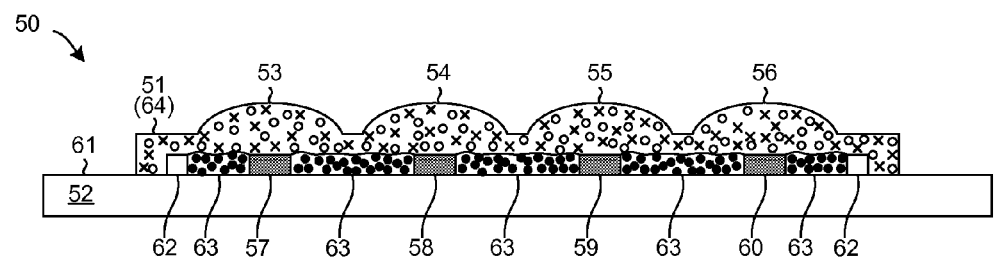
FIG. 8 is a simplified cross-sectional diagram of the white LED assembly of FIG. 7 taken along sectional line A-A.

FIG. 8 is a simplified cross-sectional diagram of the white LED assembly 50 taken along sectional line A-A of FIG. 7. Blue LED dice 57-60 are attached to the upper surface 61 of substrate 52 as illustrated. The blue LED dice 57-60 have InGaN/GaN Multiple Quantum Well (MQW) active regions and therefore emit relatively narrowband blue light having a wavelength in a range from 445 nanometers (nm) to about 455 nm. Details such as the contour of the upper surface of substrate 52, various contact terminals, conductive layers, insulative layer, solder mask layers, highly reflective coating layers, and wire bonds are omitted from the diagram in order not to obscure other parts of the diagram and to simplify the corresponding description. In the illustrated example, a peripheral square retaining ring 62 is provided around the two-dimensional array of dice. Peripheral retaining ring 62 may, for example, be a pre-molded silicone object that after pre-molding and curing is attached to the upper surface of substrate 52. In other examples, an amount of uncured silicone or another curable material is placed onto the substrate and is allowed to cure in place to form the structure of the retaining ring.

A first volume 63 of a first luminescent material is formed so that volume 63 surrounds each of the dice in the lateral dimension. First luminescent material includes powder particles of a first phosphor material. The particles of the first phosphor material are suspended in a transparent binding material. In the illustrated example, the binding material is silicone. In the illustrated example, the first phosphor material is a red-emitting phosphor material. In FIG. 8, the small black solid dot symbols represent red-emitting phosphor particles.

In one specific example, the red-emitting phosphor is an Europium-doped nitride-based phosphor described by the approximate formula $CaAlSiN_3:Eu^{2+}$. The red-emitting phosphor has an absorption spectrum such that the red-emitting phosphor absorbs relatively narrowband blue light emitted from the blue LED dice. The red-emitting phosphor has an emission spectrum such that the red-emitting phosphor emits relatively broadband red light having a peak wavelength of 650 nm.

The upper surface of first volume 63 lies in a plane that is roughly colinear with planar upper surface portions of the dice 57-60 as illustrated in FIG. 8. In some examples the blue LED dice are laterally-contacted blue LED dice, whereas in other examples the blue LED dice are vertically-contacted blue LED dice. Regardless of the type of blue LED die used, a portion of the upper surface of each die is substantially planar. The upper surface of first volume 63 may be slightly above the plane of these upper planar surface portions, or the upper surface of the first volume 63 may be coplanar with the plane of these upper planar surface portions, or the upper surface of the first volume 63 may be slightly below the plane of these upper planar surface portions. The upper surface of first volume 63 may be smooth, or may have a roughened surface to promote the escape of light from the LED dice upward and out of first volume 63.

In some cases, the first luminescent material is jetted onto the upper surface of substrate 52 in the form of microdots of liquid uncured phosphor-bearing silicone. In this way, the volume surrounding the dice is filled up to the approximate level of the top of the retaining ring 62. The first luminescent material of the first volume contacts the upper surface of the substrate and also contacts the side edges of each of the dice. Alternatively, the first luminescent material is put in place using a screen printing process and is allowed to cure in place. Regardless of how the first volume is filled with the first luminescent material, substantially no red phosphor is disposed directly above any part of any of the blue LED dice.

A second volume 64 of a second luminescent material has an upper surface that forms the molded array 51 of dome-shaped mini-lenses. The second luminescent material includes powder particles of a second phosphor material that are suspended in a transparent binding material. In the illustrated example, the binding material is silicone. In the illustrated example, the second phosphor material is a mixture of particles of a yellow/orange-emitting phosphor and particles of a green-emitting phosphor. In FIG. 8, the dot symbols having white centers represent yellow/orange-emitting phosphor particles, whereas the small "x" symbols represent green-emitting phosphor particles.

There is one dome-shaped structure disposed and centered above each corresponding one of the blue LED dice. The upper surface structure of the second volume may be smooth, or may have a roughened contour to promote the escape of light. The maximum distance from trough to peak of the surface-roughening contours of the upper surface of second volume 64 is in a range from one micron to one millimeter.

In one specific example, the yellow/orange-emitting phosphor is an Europium-doped silicate-based phosphor described by the approximate formula $A_3Si(OD)_4:Eu^{2+}$ and/or $A_3Si(OD)_5:Eu^{2+}$, where A is a bivalent (2+) ion of Sr, Ba, or Ca, and where D is a monovalent (1−) ion of Cl, F, N or S. The yellow/orange-emitting phosphor has an absorption spectrum such that the red-emitting phosphor absorbs relatively narrowband blue light emitted from the blue LED dice. The yellow/orange-emitting phosphor has an emission spectrum such that the yellow/orange-emitting phosphor emits relatively broadband yellow/orange light having a peak wavelength of 574 nm.

In one specific example, the green-emitting phosphor is an Europium-doped aluminate-based phosphor described by the approximate formula $M_{1-X}Eu_XAl_YO_{[1-3Y/2]}$, where M is a bivalent (2+) ion of Sr, Ba or Ca. The green-emitting phosphor has an absorption spectrum such that the green-emitting phosphor absorbs relatively narrowband blue light emitted from the blue LED dice. The green-emitting phosphor has an emission spectrum such that the green-emitting phosphor emits relatively broadband green light having a peak wavelength of 545 nm.

Figure 9:
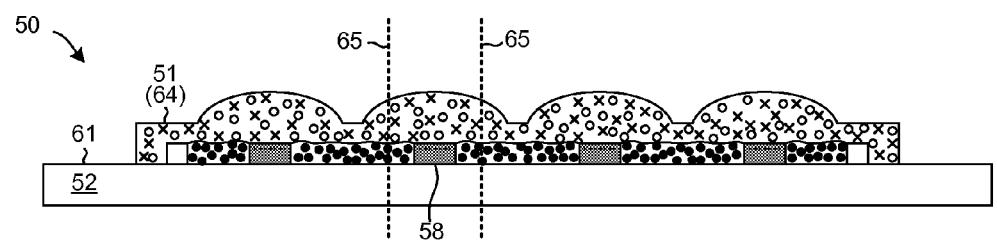
FIG. 9 is a cross-sectional diagram that identifies a section of structure of FIG. 8.

FIG. 9 is a cross-sectional diagram of white LED assembly 50 similar to the view of FIG. 8, except that a section of structure is identified with vertical dashed lines 65.

Figure 10:
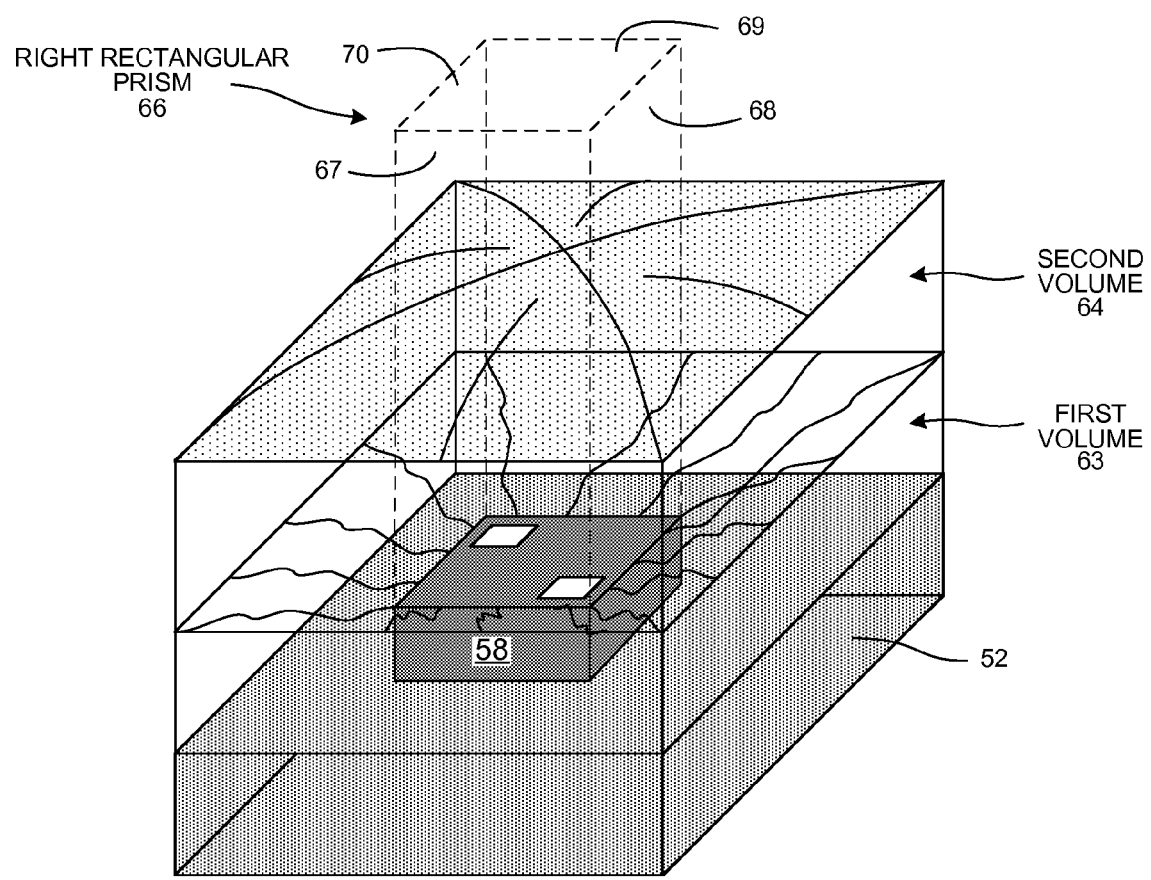
FIG. 10 is an expanded perspective view of the section identified in FIG. 9.

FIG. 10 is an expanded perspective view of the section identified in FIG. 9. A right rectangular prism (RRP) 66 extends up from the peripheral edges of the square blue LED die 58. The bottom square surface of die 58 is the base side of prism 66. The prism 66 has a square cross-section when considered from a top-down perspective. The prism 66 has four side faces 67-70. First side face 67 lies in a plane 71 (see FIG. 12) that is substantially coplanar with the plane of a first peripheral side 72 of die 58. Second side face 68 lies in a plane 73 (see FIG. 12) that is substantially coplanar with the plane of a second peripheral side 74 of die 58. Third side face 69 lies in a plane 75 (see FIG. 12) that is substantially coplanar with the plane of a third peripheral side 76 of die 58. Fourth side face 70 lies in a plane 77 (see FIG. 12) that is substantially coplanar with the plane of a fourth peripheral side 78 of die 58. The upwardly bulging upper surface of second volume 64 as illustrated in FIG. 10 is a portion of the dome-shaped surface 54 of FIGS. 7-9. The upper surface of first volume 63 as pictured in FIG. 10 has a roughened surface and is not exactly planar, but that is slightly higher than the planar upper surface portion of die 58 in places, and extends down to the level of the planar upper surface portion of die 58 where the first volume makes contact with die 58.

Figure 11:
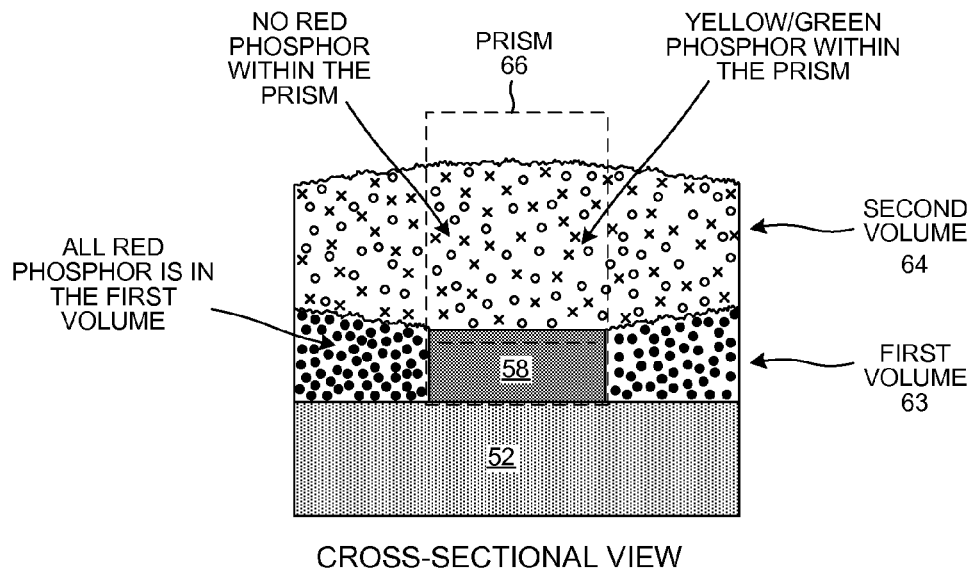
FIG. 11 is a cross-sectional view of the section of FIG. 10.

FIG. 11 is a cross-sectional view of the section of FIG. 10. There is substantially no red-emitting phosphor within the volume of prism 66, nor is there substantially any red-emitting phosphor directly above die 58. The second volume 64 contains substantially no red-emitting phosphor, rather substantially all of the red-emitting phosphor is disposed in the first volume 63 so that the first luminescent material (including red-emitting phosphor) surrounds die 58 in a lateral dimension. The first volume makes contact with the upper surface 61 of substrate 52 and also makes contact with the peripheral sides of the blue LED dice, including die 58.

Figure 12:
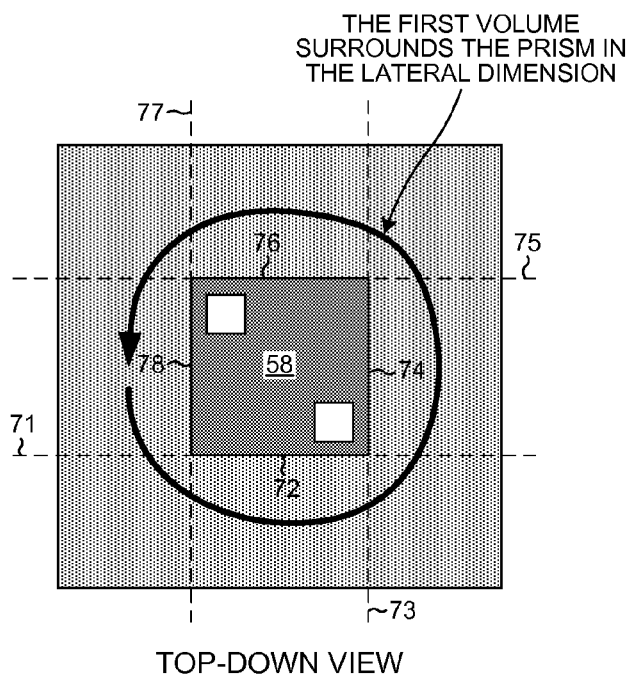
FIG. 12 is a simplified top-down diagram of the section of FIG. 10.

FIG. 12 is a simplified top-down diagram of the section of FIG. 10. The four planes 71, 73, 75 and 77 of the four corresponding side faces 67, 68, 69, and 70 of prism 66 are shown, as are the four peripheral sides 72, 74, 76 and 78 of die 58.

FIG. 13 is a diagram that shows the ranges of wavelengths that are considered to be red light, orange light, yellow light, and green light, in one example. The first phosphor material of the first luminescent material of the first volume 63 has an emission peak wavelength longer than 620 nm. The second phosphor material (the second phosphor material is actually a mixture of two phosphors) of the second luminescent material of the second volume has peak emission wavelengths shorter than 620 nm.

FIG. 14 is a table that illustrates an exemplary system of phosphors for the white LED assembly 50 of FIG. 7. The first phosphor material is the phosphor set forth in the bottom row of the table. The second phosphor material is a mixture of the phosphors set forth in the upper two rows of the table.

Figure 15:
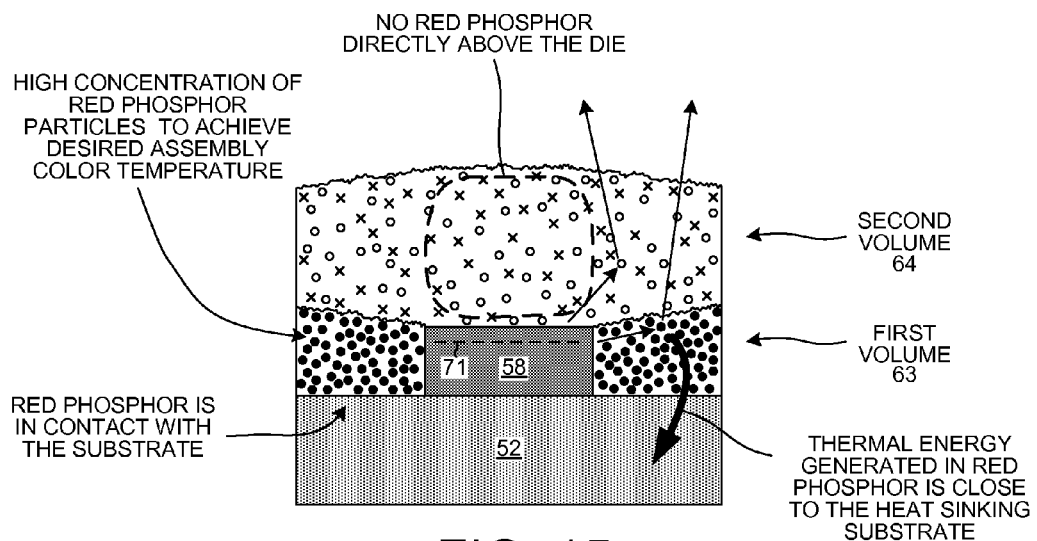
FIG. 15 is a diagram that illustrates operational aspects of the white LED assembly of FIG. 7.

FIG. 15 is a simplified cross-sectional diagram of the section of FIG. 10. A phosphor may be described to have a conversion efficiency in converting the energy of absorbed light into the energy of re-emitted light. Luminescence is very complex. There are different excitation and energy transfer and luminescence mechanisms that affect conversion efficiency, but generally speaking for the types of phosphors used in high power LEDs, the stokes shift mainly dominates, and therefore effectively determines, the conversion efficiency of the phosphor. Accordingly, for one photon of blue light absorbed for one corresponding photon of wavelength-shifted light emitted, a red-emitting phosphor will generate more heat than a yellow/orange-emitting phosphor or a green-emitting phosphor. This is true even thought the quantum efficiency of the phosphor may be very close to one hundred percent.

In accordance with one novel aspect, the relatively less-efficient red-phosphor is disposed relatively close to the heat-sinking substrate 52. None of the less-efficient, and therefore heat producing, red-emitting phosphor is disposed directly above die 58 where such phosphor would contribute to increasing the temperature at the surface of die 58. Placement of the red-emitting phosphor (the first phosphor material) adjacent die 58 and in close proximity to the upper surface of the substrate 58, and not on top of die 58, allows thermal energy generated in the relatively less efficient red-emitting phosphor to be more effectively transported to the heat-sinking substrate 58 as compared to the prior art structures of FIGS. 1-6, while simultaneously reducing the likelihood that red-emitting phosphor will interabsorb light emitted from yellow/orange-emitting phosphor and/or green-emitting phosphor of the LED assembly. Red light is of a lower energy than is yellow light, orange light and green light. Red light is not of adequate energy to excite the yellow/orange-emitting and green-emitting phosphors. Consequently, most of the red light emitted from the red-emitting phosphor of the first volume 63 will pass through the yellow/orange-emitting and green-emitting phosphors of the second volume 64 and out of the white LED assembly 50 without being absorbed. Due to the placement of first volume 63, only a relatively small amount of the yellow/orange and green light emitted by phosphor particles of second volume 64 will travel back down and into the first volume 63.

In some cases, approximately ninety percent of the blue light emitted by die 58 is emitted through the upper surface of the die, whereas about ten percent of the blue light emitted by die 58 is emitted laterally out of the sides of die 58 at the approximate level of the InGaN/GaN Multiple Quantum Well active region 79 of die 58. In the present embodiment, the concentration of red-emitting phosphor particles in first volume 63 is higher than is the concentration of yellow/orange-emitting phosphor and green-emitting phosphor in second volume 64. The relative concentrations of phosphors in the first and second volumes are set such that the composite light emitted from the upper surface of the overall white LED assembly 50 has the desired color temperature.

Figure 16:
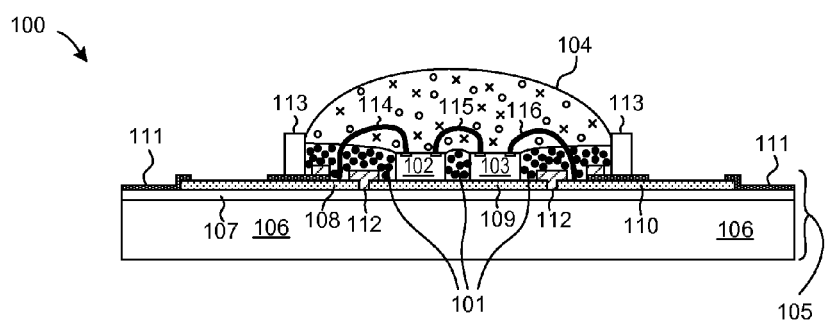
FIG. 16 is a cross-sectional side view of a second white LED assembly in accordance with another novel aspect.

FIG. 16 is a cross-sectional side view of a second white LED assembly 100 in accordance with another novel aspect. A first contiguous volume 101 of the first luminescent material surrounds dice 102 and 103 in the lateral dimension. None of the red-phosphor of the first volume is disposed directly above a blue LED die. A second contiguous volume 104 of the second luminescent material is disposed over the dice and over the first volume as illustrated to form a dome-shaped lens structure. The substrate 105 is a Metal Core Printed Circuit Board (MCPCB) involving a thick metal substrate layer 106, an insulating layer 107, thin metal conductors 108, 109 and 110, a solder mask layer 111, a highly reflective layer 112, and a retaining ring 113. Reference numerals 114, 115 and 116 identify wire bonds.

Figure 17:
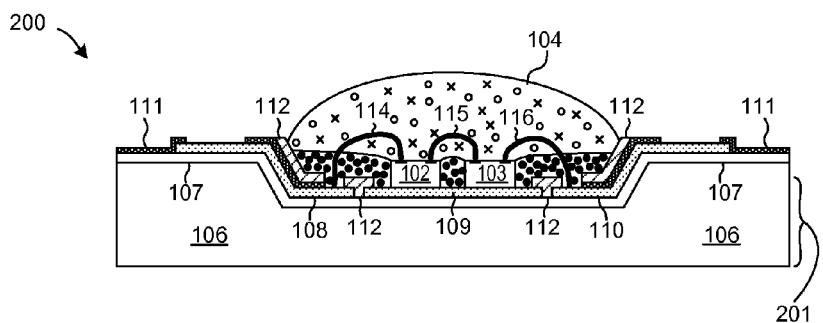
FIG. 17 is a cross-sectional side view of a third white LED assembly in accordance with another novel aspect.

FIG. 17 is a cross-sectional side view of a third white LED assembly 200 in accordance with another novel aspect. The substrate 201 is a MCPCB similar to the MCPCB of FIG. 16, except that the dice 102 and 103 are disposed in a reflector cup portion of the MCPCB. The reflector cup is the depression illustrated in FIG. 17 that extends downward into the upper surface of substrate 201. The inner sidewall surface of this reflector cup is lined with the highly reflective layer 112.

Figure 18:
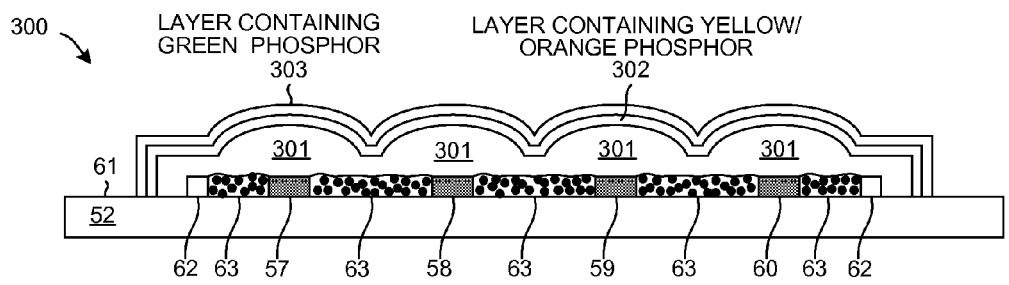
FIG. 18 is a cross-sectional side view of a fourth white LED assembly in accordance with another novel aspect.

FIG. 18 is a cross-sectional side view of a fourth white LED assembly 300 in accordance with another novel aspect. An amount 301 of transparent silicone that includes little or no phosphor particles is disposed over the first volume 63. The amount 301 of transparent silicone is molded for form a plurality of mini-lens structures. A thin layer 302 of a luminescent material involving yellow/orange-emitting phosphor particles (and few or no red-emitting phosphor particles, and few or no green-emitting phosphor particles) is disposed over the transparent silicone layer as illustrated. A thin layer 303 of a luminescent material involving green-emitting phosphor particles (and few or no yellow/orange-emitting phosphor particles and few or no red-emitting phosphor particles) is disposed over layer 302 as illustrated.

Figure 19:
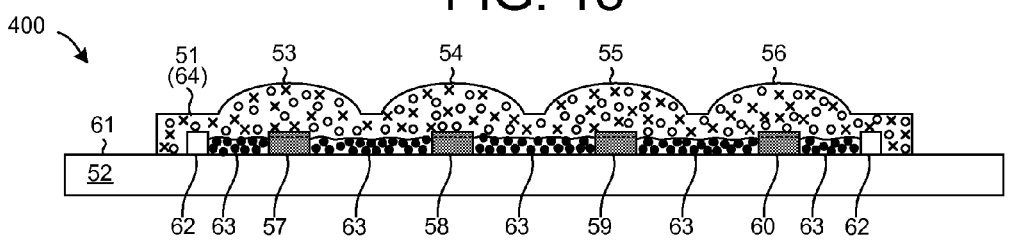
FIG. 19 is a cross-sectional side view of a fifth white LED assembly in accordance with another novel aspect.

FIG. 19 is a cross-sectional side view of a fifth white LED assembly 400 in accordance with another novel aspect. The structure of FIG. 19 is similar to the structure of FIG. 8, except that in the structure of FIG. 19 the level of the upper surface of the first volume 63 is below the level of the substantially planar upper surface portions of the blue LED dice 57-60.

Figure 20:
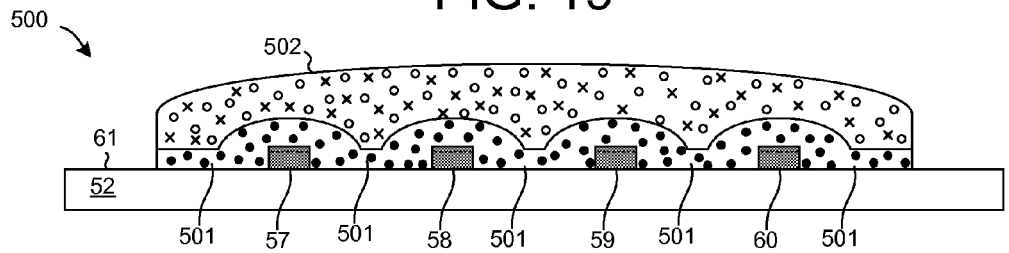
FIG. 20 is a cross-sectional side view of a sixth white LED assembly in accordance with another novel aspect.

FIG. 20 is a cross-sectional side view of a sixth white LED assembly 500 in accordance with another novel aspect. The structure of the blue LED dice 57-60 and the substrate 62 is the same as in the structure of FIG. 19. A first contiguous volume 501 of the first luminescent material forms a plurality of dome-shaped lens structures over the dice 57-60. There is one such dome-shaped lens structure over each corresponding one of the dice. The first luminescent material includes a phosphor material or materials that emit light in a spectrum that has a peak wavelength longer than 620 nm. The first luminescent material includes substantially no phosphor material that emits light in a spectrum that has a peak wavelength shorter than 620 nm. A second contiguous volume 502 of the second luminescent material forms a covering over the first volume 501 as illustrated. The second luminescent material includes one or more phosphor materials that emit light in a spectrum that has a peak wavelength shorter than 620 nm. The second luminescent material includes substantially no phosphor material that emits light in a spectrum that has a peak wavelength longer than 620 nm.

Figure 21:
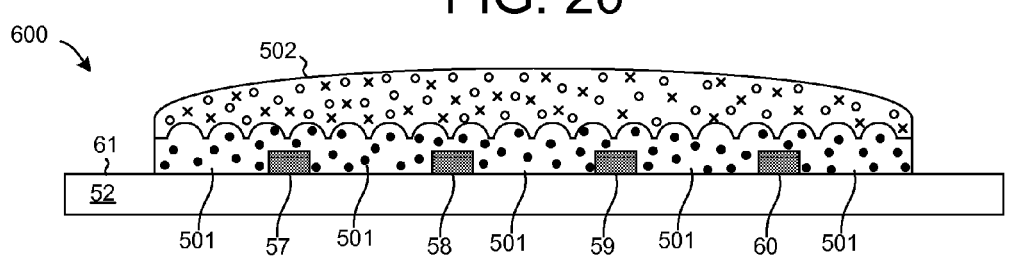
FIG. 21 is a cross-sectional side view of a seventh white LED assembly in accordance with another novel aspect.

FIG. 21 is a cross-sectional side view of a seventh white LED assembly 600 in accordance with another novel aspect. The structure and composition of the assembly of FIG. 21 is the same as the structure and composition of the assembly of FIG. 20, except that the upper surface of the first volume 501 in the structure of FIG. 21 forms many more and smaller dome-shaped lens structures. The dome-shaped structures are not provided to focus light, but rather are provided to facilitate light escaping from the first volume 501 and propagating into the second volume 502.

Figure 22:
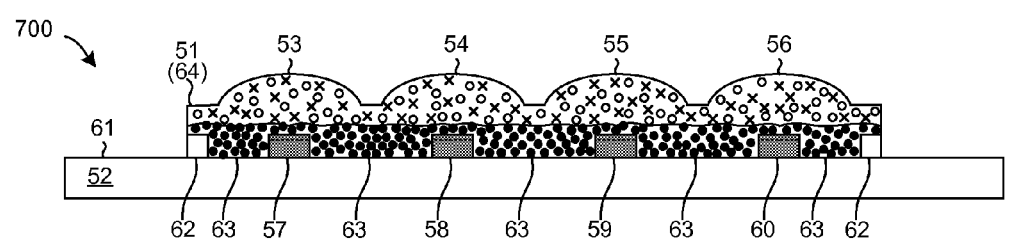
FIG. 22 is a cross-sectional side view of an eighth white LED assembly in accordance with another novel aspect.

FIG. 22 is a cross-sectional side view of an eighth white LED assembly 700 in accordance with another novel aspect. In this assembly, thin portions of the first volume 63 extend over and cover the blue LED dice 57-60. The thin portions are half a millimeter of less in thickness. First volume 63 extends down and contacts the upper surface of the substrate 52 in the areas around the dice. Second volume 64 is molded to form an array of dome-shaped mini-lens structures. There is one such dome-shaped structure disposed over each corresponding respective one of the blue LED dice. Reference numerals 53-56 identify four of these dome-shaped mini-lens structures.

Figure 23:
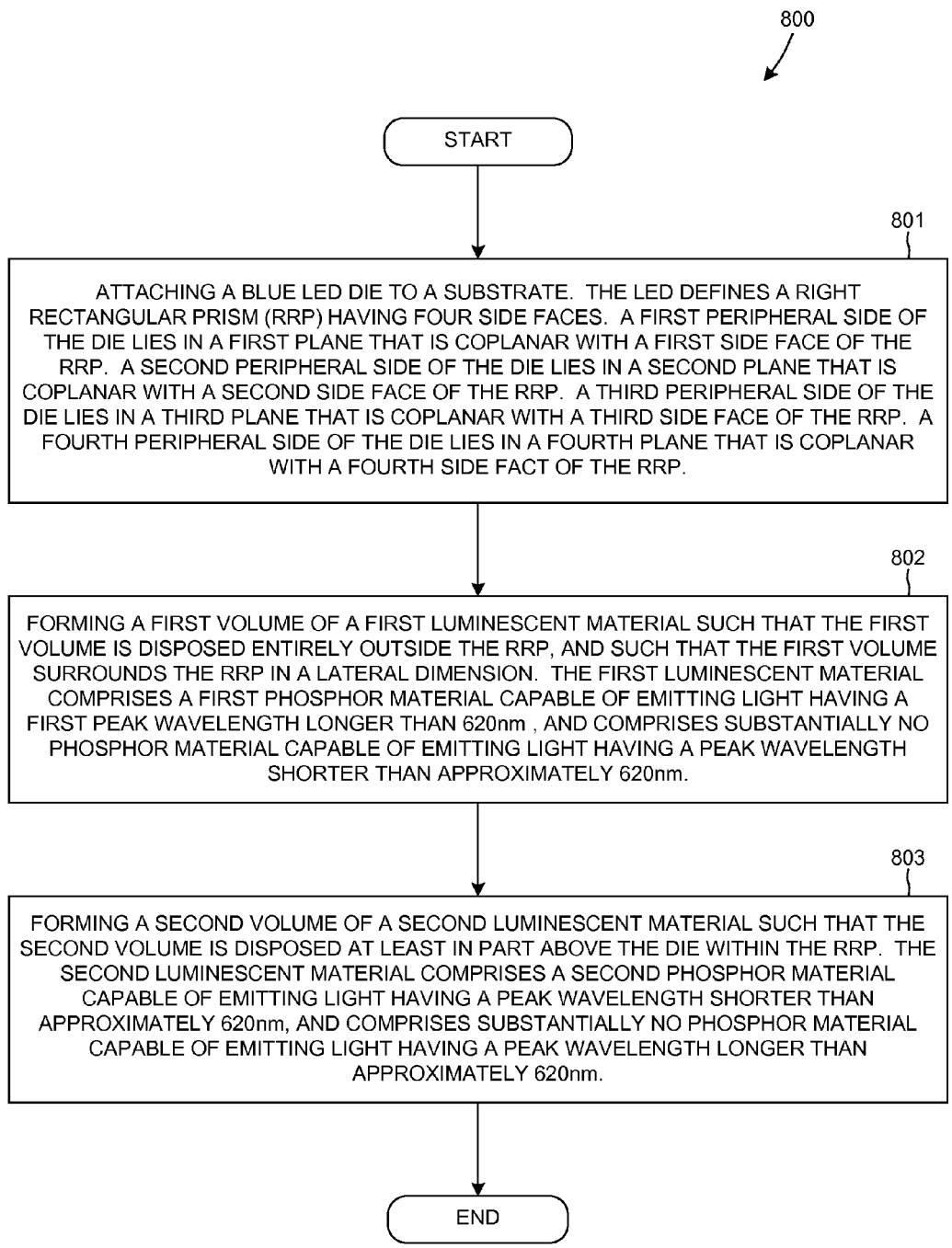
FIG. 23 is a flowchart of a method in accordance with one novel aspect.

FIG. 23 is a flowchart of a method 800 in accordance with one novel aspect. A blue LED die is attached (step 801) to a substrate such that the die defines a Right Rectangular Prism (RRP) having four side faces. The bottom surface of the die is planar and lies in a plane that is coplanar with the bottom face of the RRP. A first peripheral side of the die lies in a first plane that is coplanar with a first side face of the RRP. A second peripheral side of the die lies in a second plane that is coplanar with a second side face of the RRP. A third peripheral side of the die lies in a third plane that is coplanar with a third side face of the RRP. A fourth peripheral side of the die lies in a fourth plane that is coplanar with a fourth side face of the RRP. In one example, the RRP is a virtual prism as illustrated in FIG. 10.

A first volume of a first luminescent material is then formed (step 802) such that the first volume is disposed entirely outside the RRP, and such that the first volume surrounds the RRP in the lateral dimension. Substantially none of the first luminescent material is disposed directly above the die. The first luminescent material comprises a first phosphor material capable of emitting light having a first peak wavelength longer than 620 nm, and comprises substantially no phosphor material capable of emitting light having a peak wavelength shorter than approximately 620 nm.

In one example, the first volume is formed by jetting microdots of the first luminescent material onto the substrate around the dice in an uncured state. Each microdot is less than 100 microns in diameter. Silicone of the first luminescent material is then allowed to cure and harden. In another example, the first volume is formed by screen printing the first luminescent material onto the substrate around the dice in an uncured state, and then allowing silicone of the first luminescent material to cure and harden. In one example of method 800, substantially all phosphor particles in the first volume are the same phosphor and have the same absorption and emission characteristics. In another example of method 800, the phosphor particles in the first volume are a mixture of multiple different types of phosphors and have multiple different absorption and emission characteristics. The first volume of method 800 is, however, a single contiguous amount of the first luminescent material that extends around and contacts each LED die of the assembly. In one example the first volume of method 800 is the first volume 63 of the white LED assembly 50 illustrated and explained in connection with FIGS. 7-15.

A second volume of a second luminescent material is then formed (step 803) such that the second volume is disposed at least in part above the die within the RRP. The second luminescent material comprises a second phosphor material capable of emitting light having a second peak wavelength shorter than 620 nm, and comprises substantially no phosphor material capable of emitting light having a peak wavelength longer than approximately 620 nm. In one example the second volume is the second volume 64 of the white LED assembly 50 illustrated and explained in connection with FIGS. 7-15. In one example of method 800, substantially all phosphor particles in the second volume are the same phosphor and have the same absorption and emission characteristics. In another example of method 800, the phosphor particles in the second volume are a mixture of multiple different types of phosphors and have multiple different absorption and emission characteristics. The second volume of method 800 is, however, a single contiguous amount of the second luminescent material that extends over and covers all the LED dice of the assembly.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A light emitting diode assembly comprising:
   a light emitting diode (LED) die;
   a first luminescent material that surrounds the LED die, wherein none of the first luminescent material is disposed laterally above the LED die, wherein the first luminescent material comprises a first phosphor material capable of emitting light having a first peak wavelength longer than 620 nanometers, and wherein the first luminescent material comprises substantially no phosphor material capable of emitting light having a peak wavelength shorter than approximately 620 nanometers; and
   a second luminescent material that is disposed at least in part laterally above the LED die, wherein the second luminescent material comprises a second phosphor material capable of emitting light having a second peak wavelength shorter than 620 nanometers, and wherein the second luminescent material comprises substantially no phosphor material capable of emitting light having a peak wavelength longer than approximately 620 nanometers.

2. The light emitting diode assembly of claim 1, wherein the first luminescent material comprises the first phosphor material suspended in a transparent binding material.

3. The light emitting diode assembly of claim 1, further comprising:
   a lens disposed above the first luminescent material and below the second luminescent material, wherein the lens is substantially free of phosphor.

4. The light emitting diode assembly of claim 1, further comprising:
   a metal core printed circuit board, wherein the LED die is disposed on the metal core printed circuit board.

5. The light emitting diode assembly of claim 1, further comprising:
a substrate, wherein the first luminescent material contacts the substrate and contacts the LED die.

6. The light emitting diode assembly of claim 1, wherein the first luminescent material has a first upper surface, wherein the LED die has a second upper surface, and wherein the first upper surface and the second upper surface are roughly coplanar.

7. The light emitting diode assembly of claim 1, wherein the first luminescent material has a first upper surface, wherein the LED die has a planar upper surface, and wherein the first upper surface is slightly higher than the planar upper surface and extends down to the level of the planar surface where the first luminescent material makes contact with the LED die.

8. The light emitting diode assembly of claim 1, further comprising:
a substrate, wherein the LED die is disposed on the substrate, wherein the LED die has a planar upper surface that extends in a plane, and wherein the first luminescent material is disposed entirely between the plane of the upper surface and the substrate.

9. The light emitting diode assembly of claim 1, wherein the second luminescent material forms a dome-shaped lens centered above the LED die.

10. The light emitting diode assembly of claim 1, wherein the first phosphor material is present at a first concentration in the first luminescent material, wherein the second phosphor material is present at a second concentration in the second luminescent material, and wherein the first concentration is greater than the second concentration.

11. The light emitting diode assembly of claim 1, further comprising:
a structure disposed between the LED die and the second luminescent material, wherein the structure has a dome-shaped surface, and wherein the structure is substantially free of phosphor material.

12. A method comprising:
mounting a light emitting diode (LED) die on a substrate;
jetting microdots of a first luminescent material in an uncured state onto the substrate around the LED die without allowing the first luminescent material to be situated laterally above the LED die, wherein the first luminescent material comprises a first phosphor material capable of emitting light having a first peak wavelength longer than 620 nanometers, and wherein the first luminescent material comprises substantially no phosphor material capable of emitting light having a peak wavelength shorter than approximately 620 nanometers;
curing the first luminescent material; and
forming a layer of a second luminescent material at least in part laterally above the LED die, wherein the second luminescent material comprises a second phosphor material capable of emitting light having a second peak wavelength shorter than 620 nanometers, and wherein the second luminescent material comprises substantially no phosphor material capable of emitting light having a peak wavelength longer than approximately 620 nanometers.

13. The method of claim 12, wherein each microdot of the first luminescent material is less than 100 microns in diameter.

14. The method of claim 12, wherein the forming of the layer of second luminescent material forms a dome-shaped lens centered above the LED die.

15. The method of claim 12, wherein the first luminescent material contacts the substrate and contacts the LED die.

16. The method of claim 12, further comprising:
forming a structure above the LED die and below the second luminescent material, wherein the structure has a dome-shaped surface, and wherein the structure is substantially free of phosphor material.

17. The method of claim 16, wherein the layer of second luminescent material has a substantially uniform thickness that extends over and covers the dome-shaped surface.

18. A device comprising:
a light emitting diode (LED) die;
a first luminescent material that surrounds the LED die, wherein none of the first luminescent material is disposed laterally above the LED die, wherein the first luminescent material comprises red-emitting phosphor particles suspended in a transparent binding material; and
a second luminescent material that is disposed at least in part laterally above the LED die, wherein the second luminescent material comprises second phosphor particles, wherein the second luminescent material contains substantially no red-emitting phosphor particles, and wherein the first luminescent material contains substantially no second phosphor particles.

19. The device of claim 18, wherein the transparent binding material is taken from the group consisting of: silicone, resin and epoxy.

20. The device of claim 18, further comprising:
a substrate, wherein the LED die is disposed on the substrate, and wherein the first luminescent material contacts the substrate and contacts the LED die.

* * * * *